United States Patent
Chen et al.

(10) Patent No.: US 10,509,887 B2
(45) Date of Patent: Dec. 17, 2019

(54) MUST-JOIN PIN SIGN-OFF METHOD

(71) Applicant: Taiwan Semiconductor Manufacturing Co., Ltd., Hsinchu (TW)

(72) Inventors: Sheng-Hsiung Chen, Hsinchu County (TW); Ming-Huei Tsai, Miaoli County (TW); Shao-Huan Wang, Taichung (TW); Shu-Yu Chen, Hsinchu (TW); Wen-Hao Chen, Hsinchu (TW); Chun-Chen Chen, Hsinchu County (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 71 days.

(21) Appl. No.: 15/908,353

(22) Filed: Feb. 28, 2018

(65) Prior Publication Data
US 2019/0155983 A1 May 23, 2019

Related U.S. Application Data

(60) Provisional application No. 62/589,219, filed on Nov. 21, 2017.

(51) Int. Cl.
*G06F 17/50* (2006.01)
*H01L 21/67* (2006.01)

(52) U.S. Cl.
CPC ...... *G06F 17/5081* (2013.01); *G06F 17/5072* (2013.01); *G06F 17/5077* (2013.01); *H01L 21/67282* (2013.01); *H01L 21/67288* (2013.01)

(58) Field of Classification Search
CPC .................. G06F 17/5081; G06F 17/5077
USPC .......................................... 716/136
See application file for complete search history.

(56) References Cited

U.S. PATENT DOCUMENTS

| | | | | |
|---|---|---|---|---|
| 5,072,402 A * | 12/1991 | Ashtaputre | ......... | G06F 17/5077 716/130 |
| 5,404,033 A * | 4/1995 | Wong | .................. | G06F 17/5068 257/202 |
| 8,402,404 B1 * | 3/2013 | Mehta | ..................... | G06F 17/50 716/106 |
| 8,645,896 B1 * | 2/2014 | Suri | .................... | G06F 17/5081 716/136 |
| 2009/0319968 A1 * | 12/2009 | Wang | .................. | G06F 17/5068 716/106 |

(Continued)

*Primary Examiner* — Suchin Parihar
(74) *Attorney, Agent, or Firm* — Sterne, Kessler, Goldstein & Fox P.L.L.C.

(57) ABSTRACT

The present disclosure describes a method for detecting unacceptable connection patterns. The method includes, using a processor to perform at least one of: performing an automated place-and-route (APR) process on a circuit layout that includes a first standard cell without a marker layer to generate a circuit graphic database system (GDS) file from the circuit layout, generating a standard-cell GDS file that includes a second standard cell with at least one marker layer applied to the second standard cell, and merging the circuit GDS file with the standard-cell GDS file to generate a merged GDS file that includes the first standard cell with at least one marker layer based on the second standard cell. The method further includes determining whether a connection pattern of the first standard cell in the merged GDS file is an unacceptable connection pattern.

20 Claims, 11 Drawing Sheets

(56) References Cited

U.S. PATENT DOCUMENTS

| | | | |
|---|---|---|---|
| 2015/0200159 A1* | 7/2015 | Chen .................. | H01L 23/5226 257/774 |
| 2015/0234979 A1* | 8/2015 | Mehta ................. | G06F 17/5081 716/107 |
| 2016/0085898 A1* | 3/2016 | Manohar ............. | G06F 17/5068 716/124 |

* cited by examiner

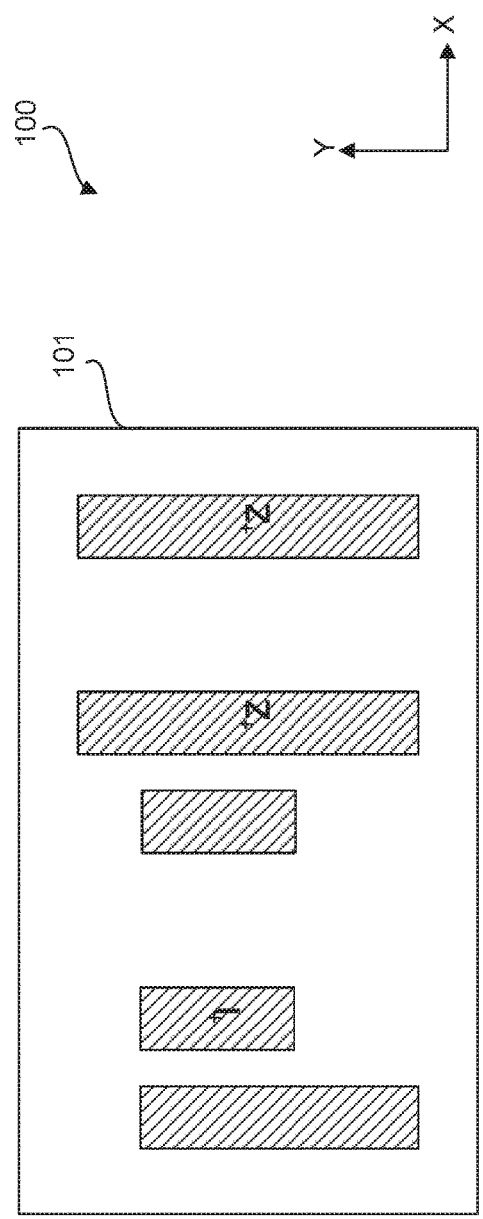
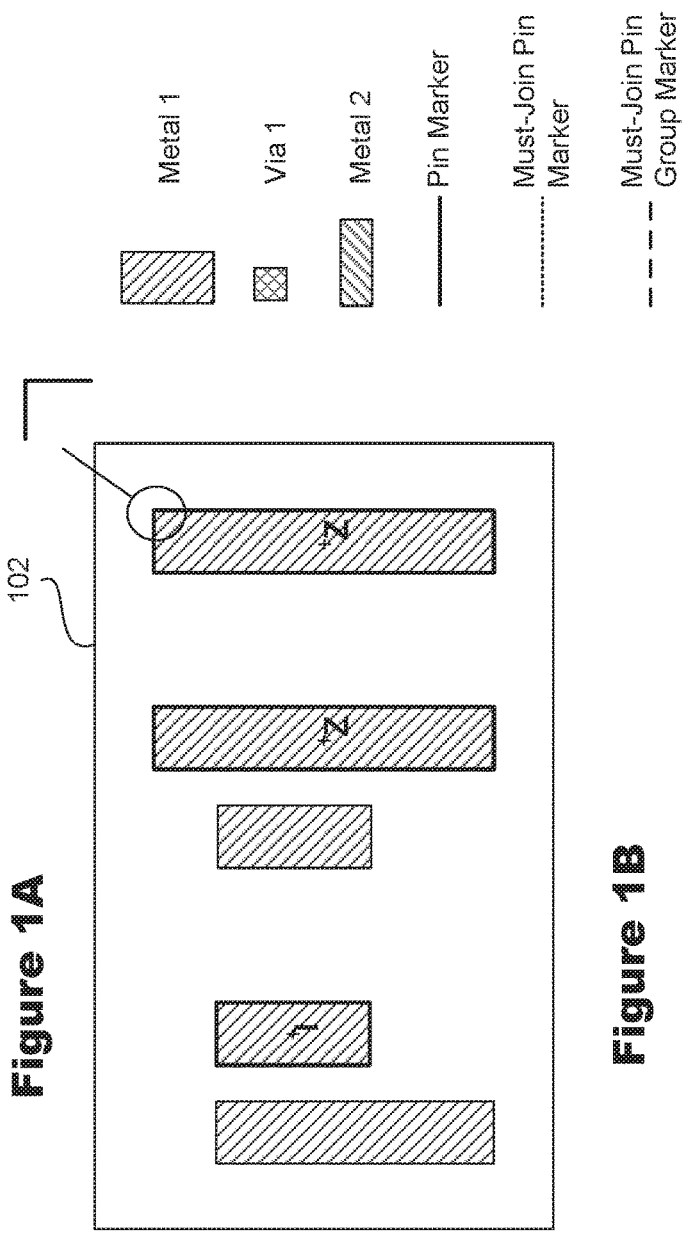
Figure 1A
Figure 1B

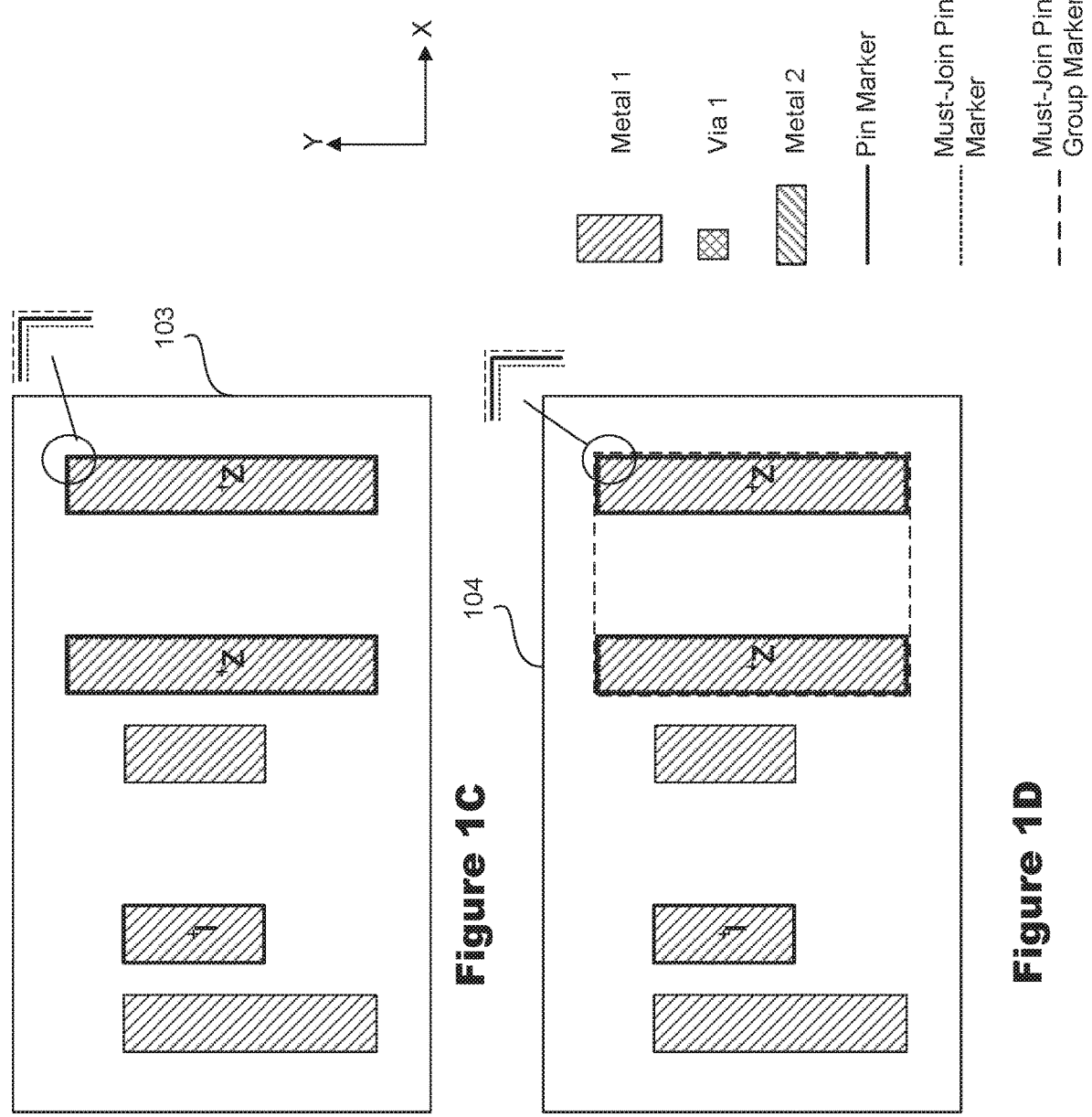

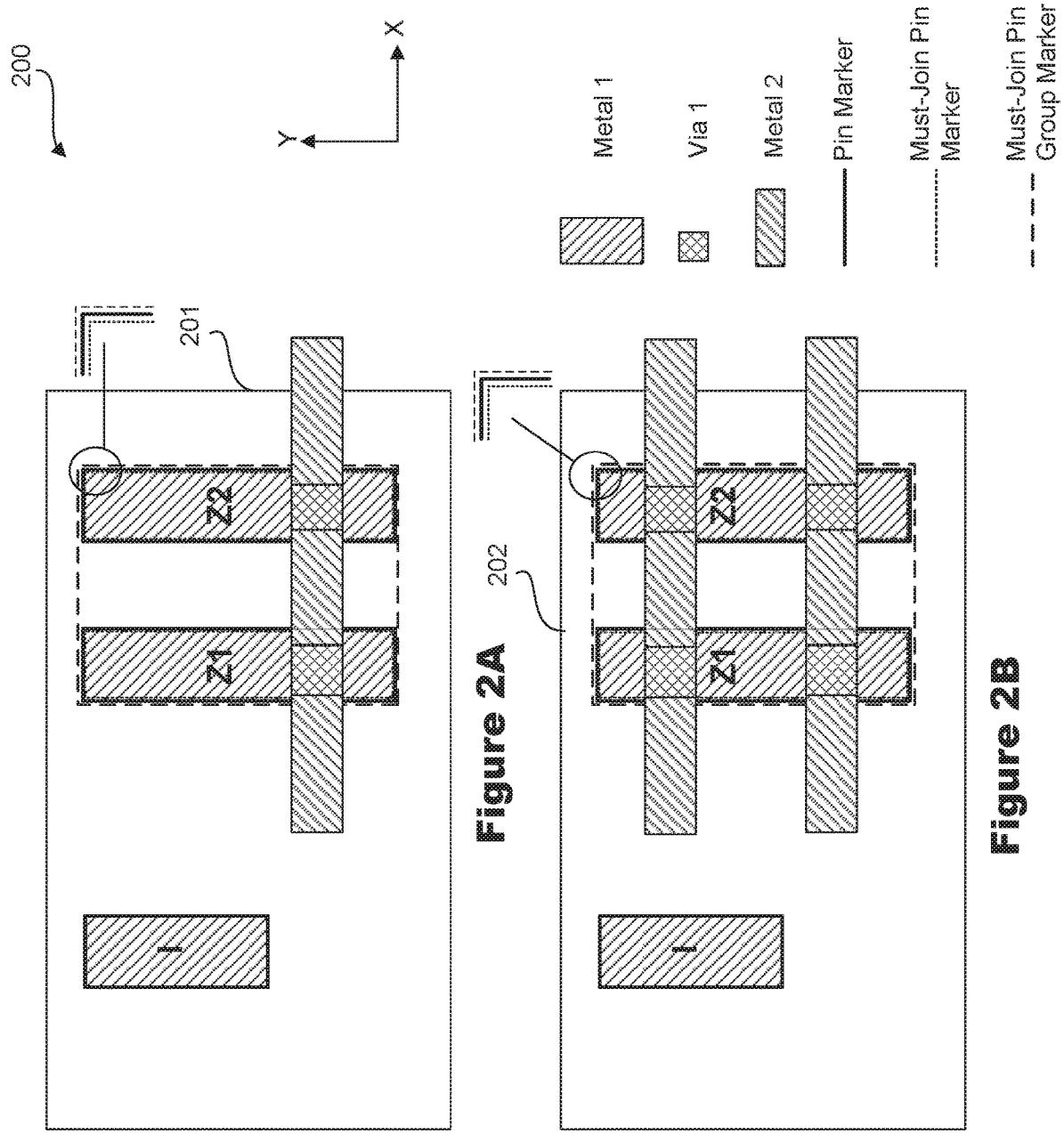

MUST-JOIN PIN SIGN-OFF METHOD

CROSS-REFERENCE TO RELATED APPLICATIONS

This application claims priority of U.S. Provisional Patent Application No. 62/589,219, titled "Must-Join Pin Sign-Off Method," filed Nov. 21, 2017, the disclosure of which is incorporated by reference in its entirety.

BACKGROUND

The semiconductor integrated circuit (IC) industry has experienced exponential growth. In semiconductor IC design, standard cell methodologies can be used for the design of semiconductor devices on a chip. Standard cell methodologies use standard cells as abstract representations of certain functions to integrate, for example, millions devices on a single chip. Accordingly, a large number of standard cells are used in the semiconductor IC design.

Input and output pins of the standard cell can be connected to other pins or parts of the IC design to receive or transmit signals. Due to the large number of standard cells used in the IC design, non-ideal connection patterns or unacceptable pin connection patterns may not be detected by IC design tools. As a result, the IC can be susceptible to malfunction or device failure.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIG. 1A is an illustration of example pins in a standard cell, according to some embodiments.

FIGS. 1B-1D are illustrations of example marker layers in standard cells, according to some embodiments.

FIGS. 2A-2B and 3A-3C are illustrations of example connection patterns in standard cells, according to some embodiments.

DETAILED DESCRIPTION

Figure 3A:
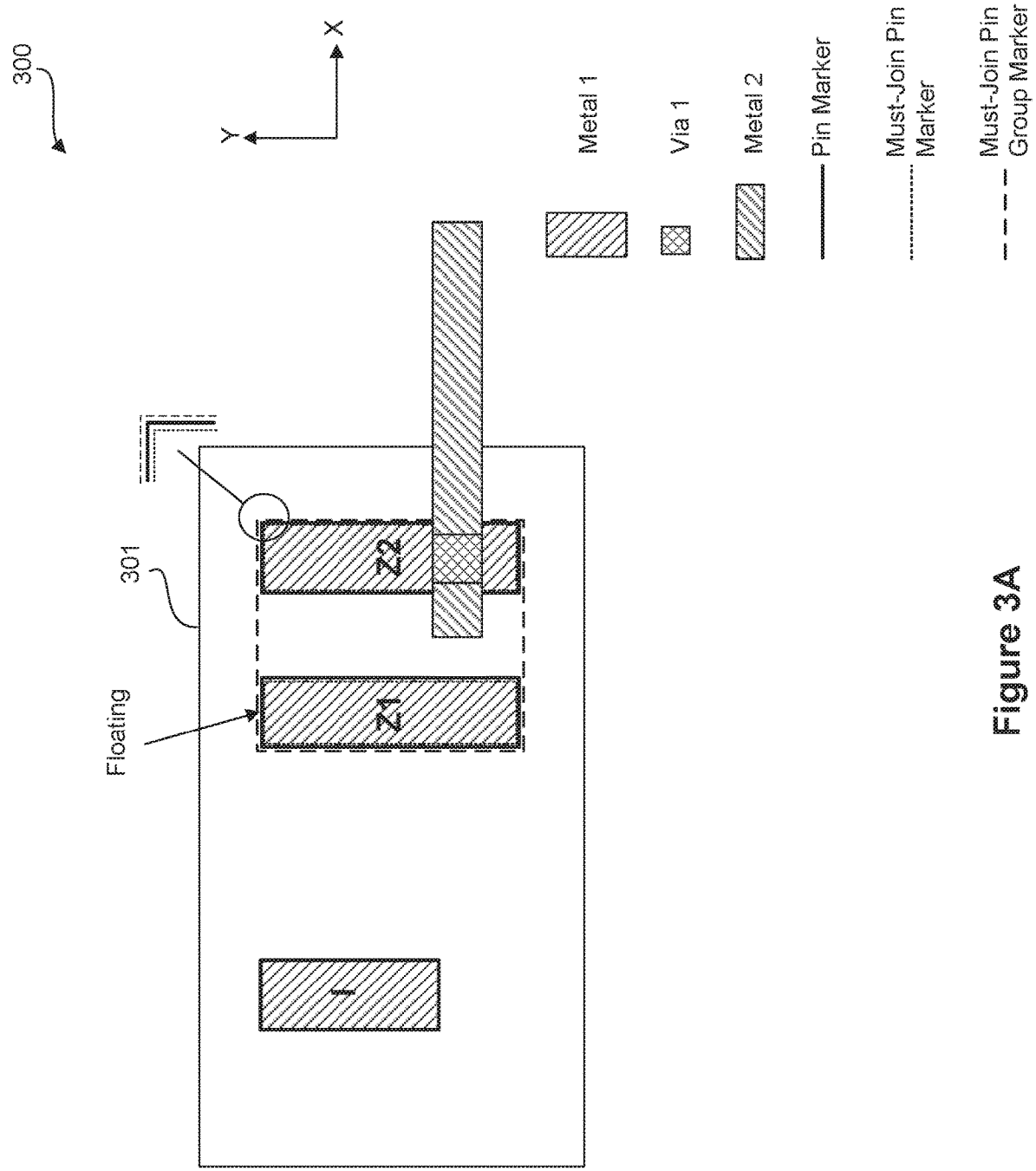

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In semiconductor IC design, input and output pin(s) of a standard cell provide electric connections between the standard cell and other parts of the IC design (e.g., other circuits or logic blocks). An input or output pin can have more than one portion associated with an input or output signal. For ease of description, each portion is referred to as a pin (e.g., an input pin or an output pin) in the present disclosure. For example, a standard cell with a high-current drive capability (also referred to herein as "high-driving standard cell") can include an output with multiple output pins. A metal interconnect can electrically connect to one or more of the multiple output pins—thus allowing the high-driving standard cell to "drive" other circuits of the IC design. An output current can be transmitted from the high-driving standard cell's output pins to the metal interconnect through one or more vias formed between the output pins and the metal interconnect.

In an IC design, a connection between one or more pins of a standard cell and other circuits may be necessary for proper circuit operation. These one or more pins are referred to as "must-join pins." For example, an output pin of a high-driving standard cell may need to be connected to other circuits of the IC design to provide sufficient driving current to ensure proper circuit operation and performance. In some embodiments, a must-join pin is connected to a metal interconnect in a metal layer directly above the must-join pin to minimize contact resistance between the must-join pin and the metal interconnect, and to provide consistency in the IC design. Accordingly, an output current provided by the high-driving standard cell, through the must-join pin, can be maximized.

Pins can be connected to metal interconnects using multiple methods. One method is pre-connection of the pins with metal interconnects in standard cells before an automated place-and-route (APR) process. The APR process places standard cells in an IC design layout and wires the standard cells accordingly. This method can ensure that desired pins are connected but can cause reduced flexibility for the APR tool/software to place and route the standard cells.

Another method is connection of the pins and metal interconnects through the APR tool after standard cells are selected. This method can provide higher flexibility for the APR tool to place and route the standard cells, but the APR tool may not detect unacceptable (e.g., non-ideal or undesirable) connection patterns. As a result, in a GDS file for a final tape-out (the final stage of the IC design process prior to manufacturing), unacceptable connection patterns can exist, thus causing increases in contact resistance between the pins and the metal interconnect. For a high-driving standard cell, unacceptable connection patterns can cause the cell's current driving capability to decrease due to the increase in resistance. The decrease in current driving capability can result in a slower performance in circuits driven by the high-driving standard cell.

Embodiments of the present disclosure describe a "sign-off" method to detect unacceptable connection patterns in standard cells in a GDS file using marker layers. In some embodiments, the marker layers can be used to restrict pin access locations for the APR tool to access pins of the standard cell so that a desired electromagnetic circuit performance can be achieved. Connection patterns can be improved based on a result of the sign-off method, thus improving consistency and predictability of standard cell timing (e.g., timing associated with a high-driving standard cell driving other circuits) in the IC design. Thus, the GDS file for tape-out can have a reduced number of unacceptable connection patterns and the manufactured circuit can have improved device performance.

FIG. 1A is an illustration of exemplary pins in standard cells 101-104, according to some embodiments. Pin "I" can represent an input pin, and pin "Z" can represent an output pin. Pins not labeled with "I" or "Z" can be other internal pins of standard cells 101-104 and are not described in the present disclosure for simplicity.

In some embodiments, as shown in FIG. 1A, standard cell 101 has two output pins "Z" and one input pin "I." In some embodiments, the output pins labeled with "Z" are must-join pins. FIG. 1A illustrates the pins of standard cell 101 before standard cell 101 is prepared for a GUS sign-off operation.

FIGS. 1B-1D are illustrations of exemplary marker layers in standard cells 102-104, according to some embodiments. Marker layers can be configured to mark different types of pins. One or more marker layers can be formed or placed in the same or different standard cells to mark pins such that unacceptable connection patterns can be distinguished in a GDS sign-off operation (described in further detail below). The marker layers can be placed in the standard cells when the standard cells are being prepared for the GDS sign-off operation. The marker layers can be placed manually or automatically by the design tool (e.g., an electronic design automation (EDA) design tool) when the standard cells are selected from a library. The marker layers can be placed on desired pins for detection of unacceptable connection patterns in the GDS sign-off operation.

For illustrative purposes, the marker layers are illustrated in different line styles encompassing the pins. The marker layers can be any suitable patterns (e.g., a colored line) customized or defined by the design tool. For example, the design tool can allow the marker layer to be visible—e.g., a colored/patterned line circling a pin. In another example, a marker layer can include a symbol or a letter attached to a pin.

FIG. 1B illustrates an example pin-marker layer in standard cell 102, according to some embodiments. The pin-marker layer can include one or more pin markers for labeling or marking pins that are to be connected to a metal interconnect. The design tool can define the type of pins to be marked with the pin-marker layer. As an example, a pin marker is represented with a bold dark line encompassing the output pins "Z." A portion of the pin marker is enlarged in the upper right corner of standard cell 102 in FIG. 1B. Other pins can be left unmarked. As shown in FIG. 1B, standard cell includes an input pin "I" and two output pins "Z." The input pin "I" and the two output pins "Z" are marked with pin markers and can each be connected to a metal interconnect during an APR operation. The pins not marked with the pin-marker layer can be other internal pins different from the input pin "I" and the output pins "Z." In some embodiments, in a GDS sign-off operation, the design tool automatically checks the connection pattern of a pin marked with a pin marker (e.g., the connection pattern between the pin and a metal interconnect) and determines whether the connection pattern is acceptable/proper based on criteria stored in the design tool. Details of the criteria are described below in FIGS. 2A-2B and 3A-3C. In some embodiments, the criteria includes acceptable connection patterns and/or unacceptable connection patterns.

FIG. 1C illustrates an example must-join pin marker layer in standard cell 103, according to some embodiments. The must-join pin marker layer can include one or more must-join pin markers for labeling or marking must-join pins. If the standard cell includes one or more must-join pins, the one or more must-join pins can be marked with must-join pin markers. For ease of description, FIG. 1C is compared to FIG. 1B.

As shown in FIG. 1C, because the two output pins "Z" are must-join pins and the input pin "I" is not a must-join pin, the output pins "Z" are labeled with must-join pin markers in addition to the pin markers, and the input pin "I" is marked with a pin marker. As an example, a must-join pin marker is represented with a short dashed line encompassing a must-join pin. A portion of the must-join pin marker and a portion of the pin marker are enlarged in the upper right corner of standard cell 103 in FIG. 1C. The must-join pin marker and the pin marker can completely overlap, partially overlap, or be separate from one other. For illustrative purposes, the must-join pin marker and the pin marker are separate from one other. In some embodiments, by placing must-join pin markers on the output pins "Z," the must-join pin markers indicate to the design tool that the two output pins "Z" require a proper connection to metal interconnects in the circuit. In some embodiments, in a GDS sign-off operation, the design tool automatically checks the connection pattern of a must-join pin marked with a must-join pin marker (e.g., the connection pattern between the must-join pin and a metal interconnect) and determines whether the connection pattern is acceptable/proper based on the pre-stored criteria.

FIG. 1D illustrates an example must-join pin group marker layer in standard cell 104, according to some embodiments. The must-join pin group marker layer can include one or more must-join pin group markers for labeling or marking must-join pin groups. In some embodiments, a must-join pin group refers to a group of must-join pins that are included in a same input or output. For ease of description, FIG. 1D is compared to FIG. 1C.

As shown in FIG. 1D, because the two output pins "Z" are each included in the output of standard cell 104, the two output pins "Z" belong to the same must-join pin group. Further, because the two output pins "Z" belong to the same must-join pin group, the two output pins "Z" can be marked with a must-join pin group marker in addition to pin markers and must-join pin markers. As an example, a must-join pin group marker is represented with a long dashed line encompassing the must-join pins that belong to the same must-join pin group. A portion of the must-join pin group marker, a portion of the must-join pin marker, and a portion of the pin marker are enlarged in the upper right corner of standard cell 104 in FIG. 1D. The must-join pin group marker, the must-join pin marker, and the pin marker can completely overlap, partially overlap, or be separate from one another. For illustrative purposes, the must-join pin group marker is separate from the must-join pin marker and the pin marker. In some embodiments, by placing the must-join pin group marker on the two output pins "Z," the marker indicates to the design tool that the two output pins "Z" require a group connection in the circuit. In some embodiments, in a GDS sign-off operation, the design tool automatically checks the connection pattern of a must-join pin group marked with a must-join pin group marker (e.g., the connection pattern between the must-join pins in the must-join pin group and a metal interconnect) and determines whether the connection pattern is acceptable/proper based on the pre-stored criteria.

In some embodiments, in the GDS sign-off operation, the connection criteria or acceptable connection pattern of different types of pins are compared to the connection patterns in the GDS file based on the marker layers. In some embodiments, if the connection pattern of a pin does not meet the connection criteria or is different from the acceptable connection pattern for the pin, the connection pattern is determined to be unacceptable. In some embodiments, the GDS file does not pass the GDS sign-off process. FIGS. 2A and 2B illustrate examples of "acceptable" connection patterns for must-join pins.

FIGS. 2A and 2B are illustrations of exemplary pin connection patterns in standard cells 201 and 202, according to some embodiments. The connection patterns illustrated in FIGS. 2A and 2B can be referred to as "acceptable" connection patterns in the GDS file. A connection pattern can be formed between a pin (e.g., represented as "Metal 1") and a metal interconnect (e.g., represented as "Metal 2") through vias (e.g., represented as "Via 1"). As shown in FIGS. 2A and 2B, standard cell 201 and 202 each includes an input pin "I" and two output pins "Z1" and "Z2." The two output pins "Z1" and "Z2" are must-join pins and belong to the same output pin of standard cell 201/202, and thus belong to the same must-join pin group. The two output pins "Z1" and "Z2" are thus marked in a must-join pin group. Similar to FIG. 1D, input pin "I" can be marked with a pin marker, and output pins "Z1" and "Z2" can be marked with pin markers, must-join pin markers, and a must-join pin group marker. A portion of the pin marker, a portion of the must-join pin marker, and a portion of the must-join pin group marker are enlarged in the upper right corner of standard cells 201 and 202 in FIGS. 2A and 2B.

FIG. 2A illustrates exemplary acceptable connection patterns when the two output pins "Z1" and "Z2" are connected to a metal interconnect in standard cell 201. As shown in FIG. 2A, in some embodiments, acceptable connection patterns between a must-join pin group and a metal interconnect includes the pins of the must-join pin group being connected to the same metal interconnect. In some embodiments, acceptable connection patterns between a must-join pin group and the metal interconnect also include vias, which are formed between the must-join pins and the metal interconnect and formed along a direction in which the metal interconnect extends (e.g., x-direction).

FIG. 2B illustrates additional exemplary acceptable connection patterns when the two output pins "Z1" and "Z2" are connected to more than one metal interconnect in standard cell 202. As shown in FIG. 2B, in some embodiments, acceptable connection patterns between a must-join pin group and a metal interconnect includes the must-join pins of the must-join pin group connected to each of the metal interconnects. In some embodiments, acceptable connection patterns between a must-join pin group and multiple metal interconnects include vias, which are formed between the pins and each metal interconnect and formed along the direction the metal interconnects extend. In some embodiments, the metal interconnects are parallel along x-direction.

In some embodiments, the acceptable connection patterns or connection criteria are included or added into the design rules for the IC design. In the GDS sign-off process, connection patterns of pins can be compared with the design rules (including the acceptable connection patterns) to identify if any violations in the design rules.

Figure 3B:
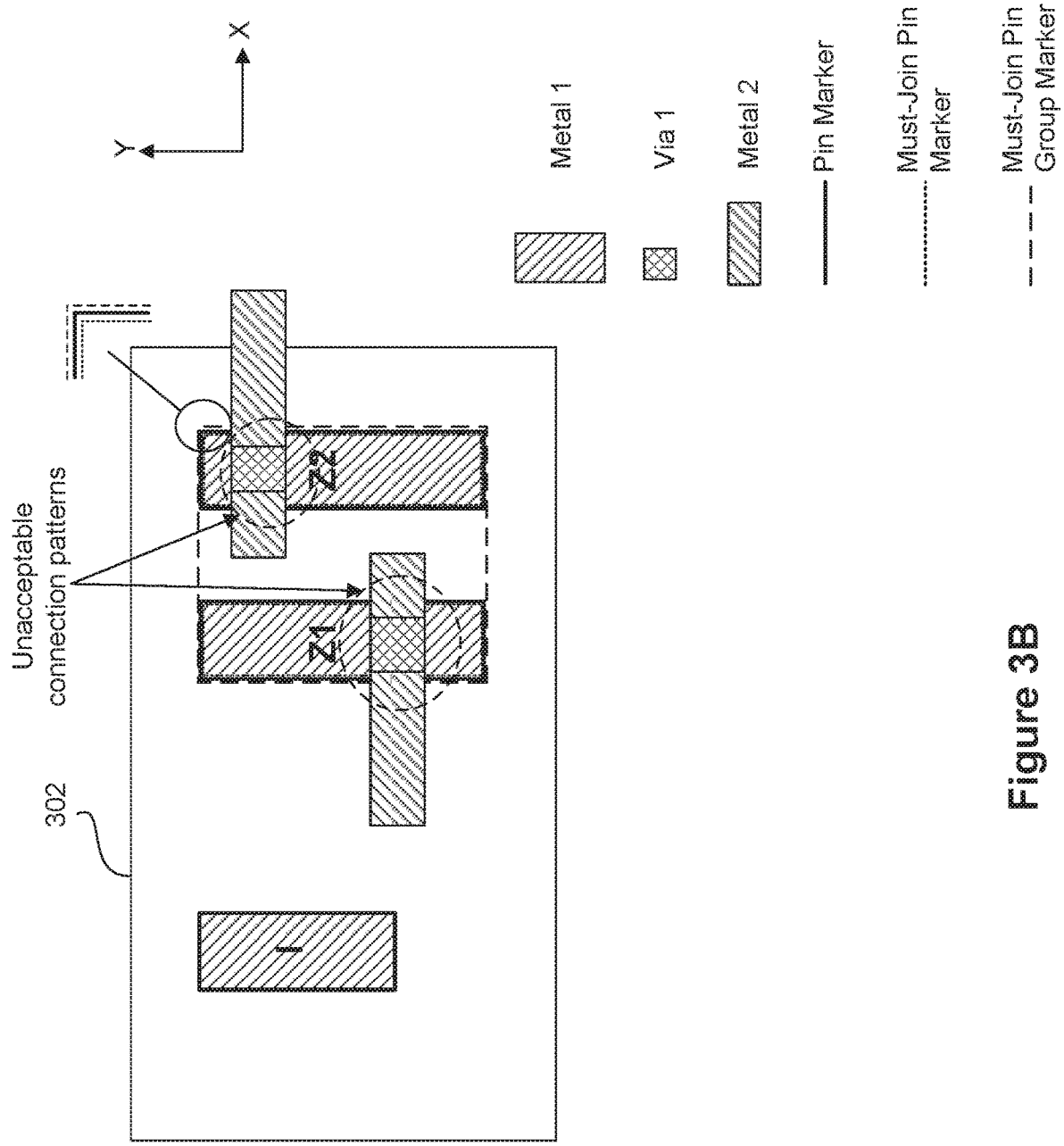
Figure 3C:
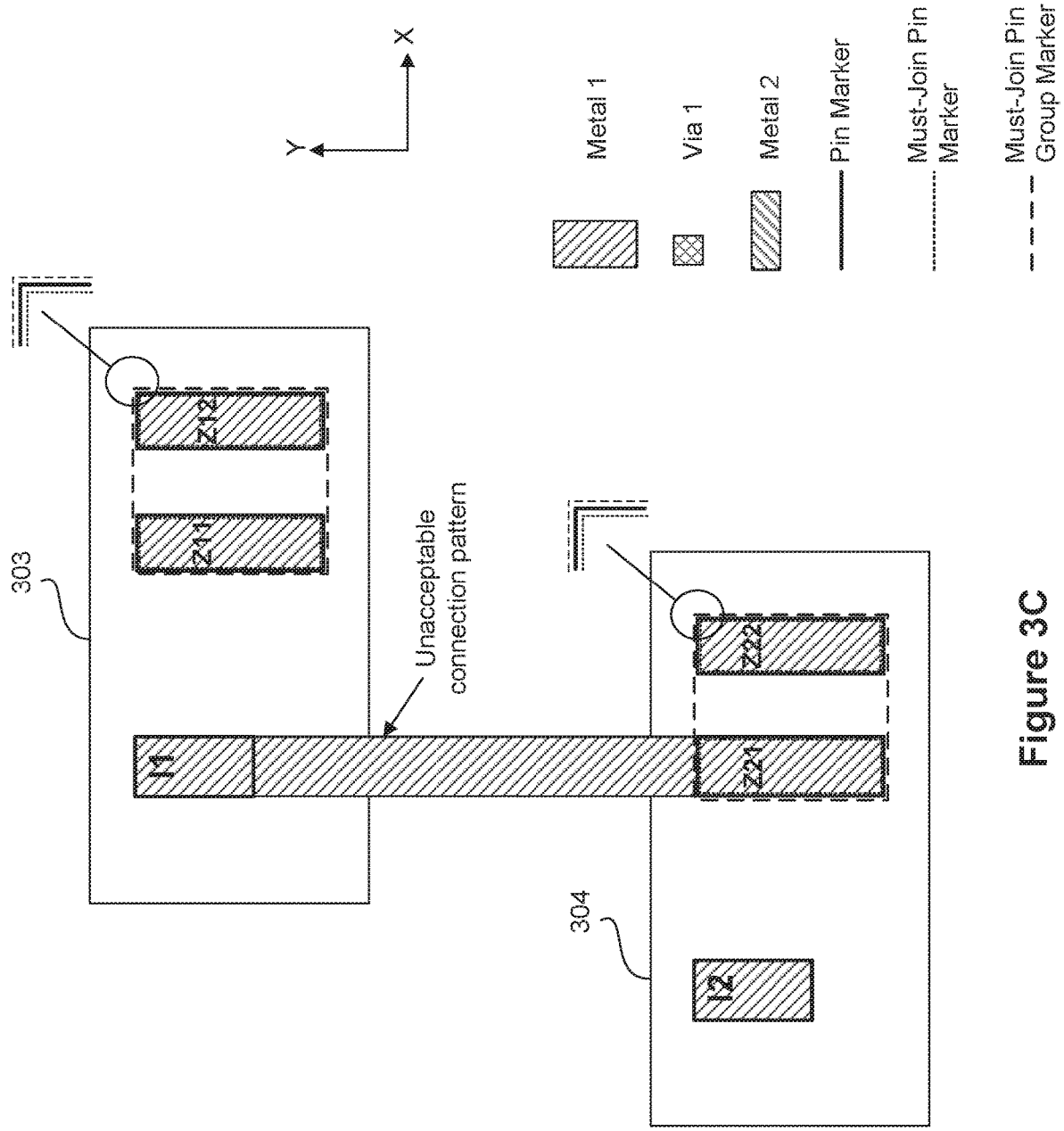

FIGS. 3A-3C illustrate other exemplary connection patterns with marker layers, according to some embodiments. FIGS. 3A and 3B illustrate connection patterns in standard cells 301 and 302, and FIG. 3C illustrates connection patterns in standard cells 303 and 304. The connection patterns illustrated in FIGS. 3A-3C can be referred to as "unacceptable" connection patterns in the GDS file. Similar to FIGS. 2A and 2B, standard cells 301 and 302 in FIGS. 3A and 3B each includes an input pin "I" and two output pins "Z1" and "Z2." The two output pins can be must-join pins of the output of standard cells 301 and 302 and thus belong to the same must-join pin group. The two output pins "Z1" and "Z2" are thus marked in a must-join pin group. Similar to FIGS. 2A and 2B, input pins "I" in FIGS. 3A and 3B can be marked with a pin marker, and output pins "Z1" and "Z2" can be marked with pin markers, must-join pin markers, and a must-join pin group marker. Similarly, in FIG. 3C, standard cell 303 includes input pin "I1" and output pins "Z11" and "Z12," and standard cell 304 includes input pin "I2" and output pins "Z21" and "Z22." The output pins of the two standard cells are must-join pins so that "Z11" and "Z12" are included in a must-join pin group, and "Z21" and "Z22" are included in a must-join pin group. A portion of the pin marker, a portion of the must-join pin marker, and a portion of the must-join pin group marker are enlarged in the upper right corner of standard cells in FIGS. 3A-3C. By applying the marker layers, ease of detection of unacceptable connection patterns can be achieved during the GDS sign-off operation.

FIG. 3A illustrates a metal interconnect connected to output pin "Z2" and not to both output pins "Z1" and "Z2." Output pin "Z1" is left floating. FIG. 3B illustrates two metal interconnects, each connected to a separate output pin "Z1" and output pin "Z2."

An issue with the connection patterns shown in FIGS. 3A and 3B includes an increased contact resistance caused by not connecting each output pin (e.g., must-join pin) of standard cell with a common metal interconnect. As a result of the increased contact resistance, a drive current outputted by the standard cell is not maximized, thus increasing the susceptibility of timing uncertainty in the IC design (as described above). Thus, in some embodiments, these connection patterns are considered unacceptable. In some embodiments, for acceptable connection patterns, each must-join pin is connected to one or more common metal interconnects.

FIG. 3C illustrates another scenario of unacceptable connection patterns in standard cells 303 and 304, according to some embodiments. As shown in FIG. 3C, the metal layer forming the inputs and outputs is the same metal layer, "Metal 1." Metal 1 directly connects output pin "Z21" of standard cell 304 to input pin "I1" of standard cell 303.

An issue with the connection pattern shown in FIG. 3C includes a potential high current from output pin "Z21" to input pin "I1," causing the "Metal 1" connecting the output pin "Z21" to input pin "I1" to "blow out" (e.g., cause an opening or gap in "Metal 1"). Thus, in some embodiments, this connection pattern is considered unacceptable. In some embodiments, acceptable connection patterns include connecting an output pin and an input pin with a suitable metal interconnect (e.g., a metal interconnect of a different layer or Metal 2).

In some embodiments, in the GDS sign-off operation, the design tool can check the connections between pins to identify unacceptable connection patterns. In an example, when a single metal interconnect is connected to a must-join pin group, the design tool can check whether must-join pins in the must-join pin group are connected to the metal interconnect. If one or more must-join pins in a must-join pin group are not connected to the metal interconnect, as illustrated in FIG. 3A, the design tool determines that the GDS file does not pass the sign-off operation. In another example, when multiple metal interconnects are connected to a must-join pin group, the design tool can check whether must-join pins in the must-join pin group are connected to the multiple metal interconnects. If one or more must-join pins in a must-join pin group are not connected to any of the metal interconnects, as illustrated in FIG. 3B, the design tool determines that the GDS file does not pass the sign-off operation. In a further example, the design tool can check whether pins are directly connected with the same metal layer that forms the pins. If one or more pins are detected to be connected with the same metal layer that forms the pins, as illustrated in FIG. 3C, the design tool determines that the GDS file does not pass the sign-off operation. When it is determined that the GDS file does not pass the sign-off operation, the design tool generates corresponding messages and/or reports for the unacceptable connection patterns. Details of the messages and/or reports are described in FIG. 5 below.

Figure 4:
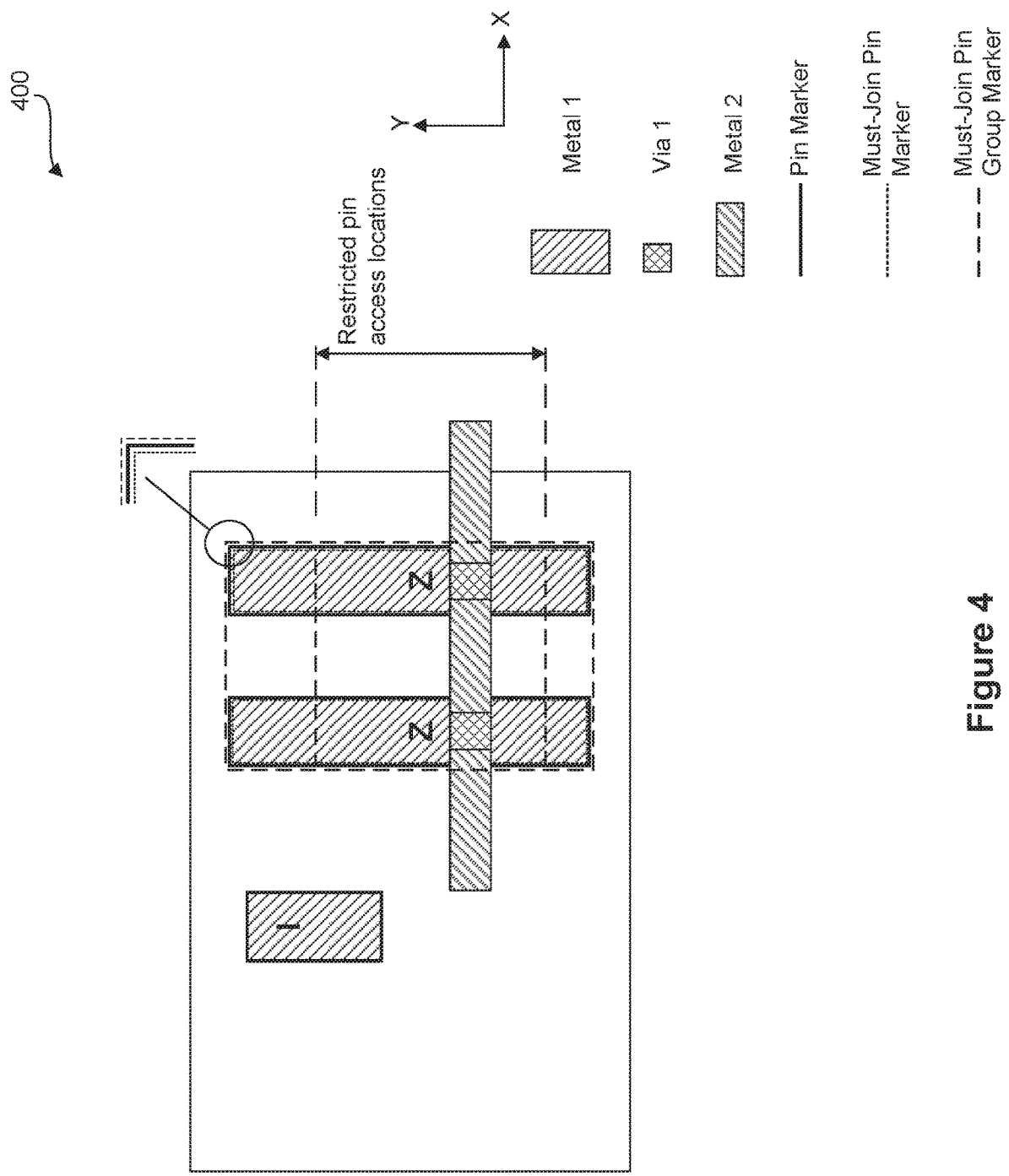
FIG. 4 is an illustration of an example application of must-join pin group markers in standard cells, according to some embodiments.

FIG. 4 is an illustration of another example application of a must-join pin group marker in a standard cell, according to some embodiments. As shown in FIG. 4, standard cell 400 includes an input pin "I" and two output pins "Z." The two output pins "Z" can be must-join pins that belong to an output of standard cell 400 and are thus included in a must-join pin group. The input pin "I" is marked with a pin marker. The output pins are marked with pin markers, must-join pin markers, and a must-join pin group marker. A portion of the pin marker, a portion of the must-join pin marker, and a portion of the must-join pin group marker are enlarged in the upper right corner of standard cell 400 in FIG. 4.

As shown in FIG. 4, in addition to identifying a must-join pin group, a must-join pin group marker can be used to restrict the pin access locations. In some embodiments, the must-join pin group marker layer can be placed in or merged with the circuit layout before the APR process. In some embodiments, the dimensions of the must-join pin group marker are reduced such that the must-join pin group marker covers a portion of the total area of the output pins. The coverage or position of the must-join pin group marker can be used to restrict locations or areas of the circuit layout where the design tool can access the output pins in the APR process. In some embodiments, the design tool is constrained to accessing the area covered by the must-join pin group marker. In some embodiments, the must-join pin group marker layer can be manually placed in the circuit layout.

In some embodiments of the present disclosure, for illustrative purposes, marker layers are placed on pins of the standard cells when applicable. The GDS sign-off operation can be customized to check for unacceptable connection patterns of certain marker layers. For example, a pin marker layer can be placed on standard cells. During the GDS sign-off operation, the design tool can be customized to check the labeling of pin markers and the unacceptable connection patterns of pins. In another example, a must-join pin group marker layer can be placed on standard cells. During the GDS sign-off operation, the design tool can be customized to check the labeling of the must-join pin group markers and the unacceptable connection patterns of must-join pin groups.

Further, for illustrative purposes, must-join pins are exemplified in output pins of standard cells. Input pins and/or other suitable pins can also be must-join pins or be included in must-join pin groups. In some embodiments, other marker layers can also be defined to label desired parts of a circuit layout, e.g., for detection of certain features in the GDS sign-off operation.

Figure 5:
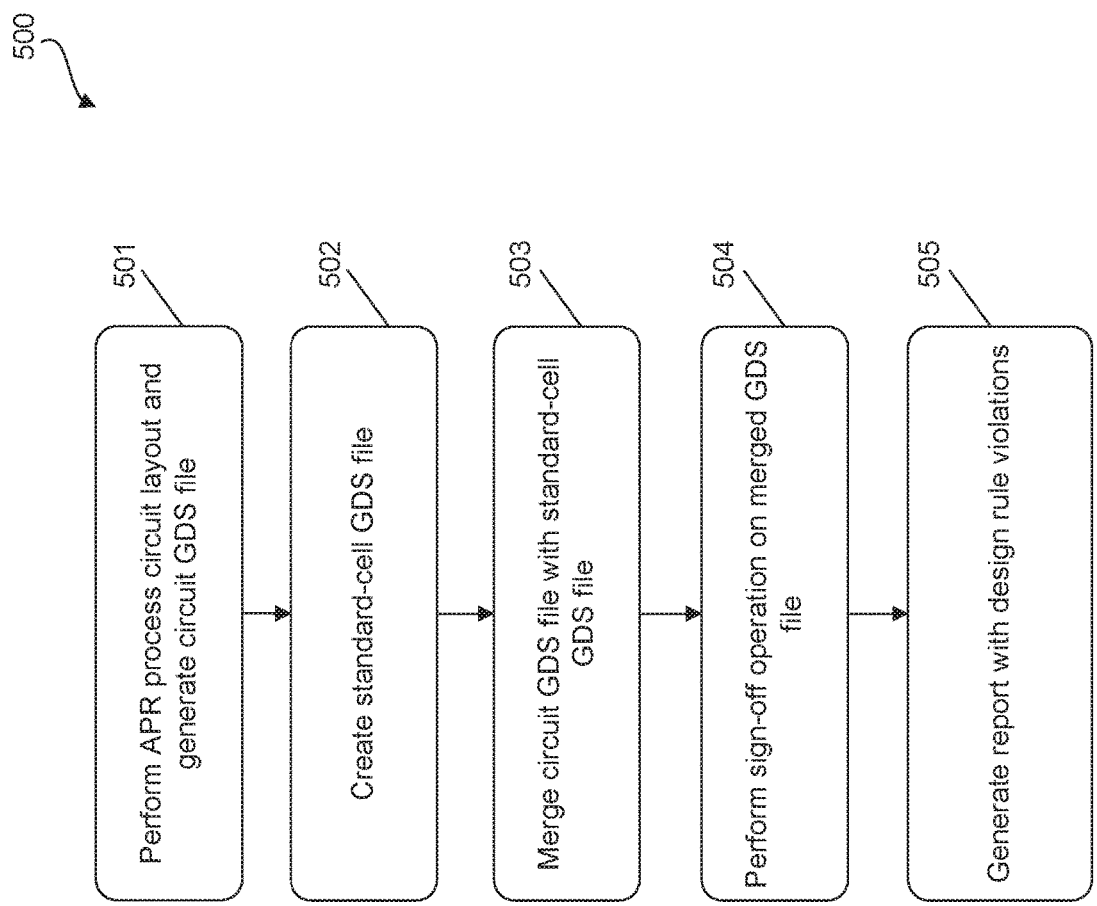
FIG. 5 is an illustration of a sign-off method, according to some embodiments.

FIG. 5 is an illustrations of an exemplary method 500 for a GDS sign-off procedure, according to some embodiments. The operations depicted in method 500 (and associated sub-operations) can be performed by, for example, an EDA tool that operates on a computer system, such as an example computer system 700 described below with respect to FIG. 7. In some embodiments, operations/steps of method 500 can be performed in different orders. Variations of method 500 should also be within the scope of the present disclosure.

In operation 501, an APR process is performed on a circuit layout and a GDS file of the circuit layout is generated. For example, the APR process can connect one or more metal interconnects with the multiple output pins of a same must-join pin group, as shown in FIGS. 2A and 2B. In another example, the APR process can fail to place proper connections between a metal interconnect and must-join pins (e.g., as shown in FIGS. 3A and 3B) and/or between standard cells (e.g., as shown in FIG. 3C). In some embodiments, the GDS file can include one or more of the standard cells with marker layers from operation 501. For ease of description, the GDS file generated in operation 501 is referred to as a "circuit GDS file.".

Figure 6:
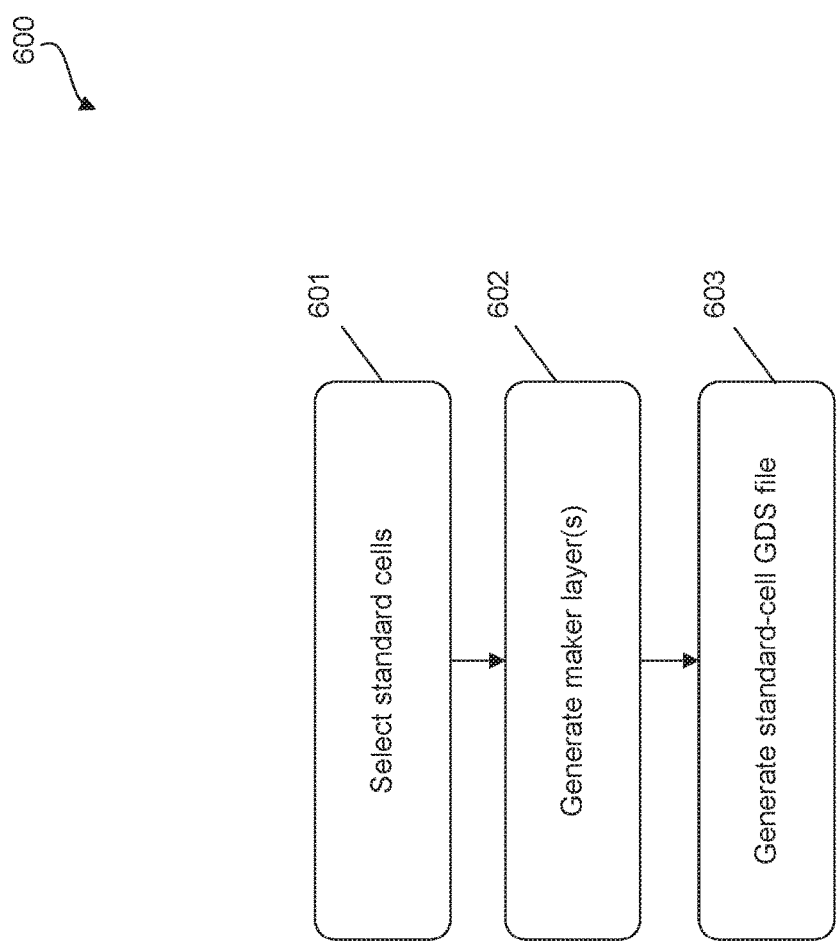
FIG. 6 is an illustration of a process to label standard cells with marker layers for a sign-off method, according to some embodiments.

In operation 502, a standard-cell GDS file is created. In some embodiments, standard-cell GDS file includes marker layers for marking the standard cells in the circuit GDS file. In some embodiments, operation 502 is referred to as a preparation step for method 500. FIG. 6 illustrates the sub-operations 600 for operation 502, according to some embodiments. In some embodiments, the order of operations 501 and 502 can switch.

In operation 601, standard cells are selected from a standard cell library. The standard cells can be any or all of an AND, OR, XOR, XNOR, NAND, inverter, or other suitable logic devices.

In operation 602, the one or more marker layers are generated in the selected standard cells. The marker layers can include one or more of the marker layers illustrated in FIGS. 1B-1D above. The marker layers can be automatically or manually placed through the design tool. The marker layers can be placed/generated to mark pins, must-join pins, and/or must-join pin groups in the standard cells. The marker layers can have different formats (e.g., circles, lines, labels, etc.) and can be recognized by a design tool (e.g., an EDA tool). The acceptable connection patterns for the marker layers and for various combinations of marker layers can be stored in the design tool as a part of design rules for an IC design.

In operation 603, a standard-cell GDS file is generated. The standard-cell GDS file includes various standard cells and marker layers applied to the standard cells. The marker layers can include one or more of the pin marker layer, must-join pin marker layer, and must-join pin group marker layer as illustrated in FIGS. 1B-1D. The standard cells with marker layers in the standard-cell GDS file can be merged with the same type of standard cells in the circuit GDS file to mark the standard cells in the circuit GDS file with corresponding marker layers. Details of the merging operation is described in operation 503. In some embodiments, the standard-cell GDS file can be automatically generated by the design tool.

In referring to method 500 of FIG. 5, in operation 503, the circuit GDS file is merged with the standard-cell GDS file. In some embodiments, standard cells with marker layers in the standard-cell GDS file are merged with corresponding standard cells without markers in the circuit GDS file so that the merged GDS file includes details of the circuit and the marker layers of the standard cells. For example, a NAND gate standard cell with marker layers in the standard-cell GDS file can be merged with a NAND gate standard cell (e.g., a same type of standard cell) without marker layers in the circuit GDS file. In some embodiments, a standard cell with the marker layers in the standard-cell GDS file is merged with multiple standard cells of the same type in the circuit GDS file. For example, the standard-cell GDS file includes a NAND gate standard cell with marker layers, and the circuit GDS file includes NAND gate standard cells without marker layers. The NAND gate standard cell with marker layers can be merged with the NAND gate standard cells without marker layers so that these NAND gate standard cells include the marker layers in the merged GDS file. In some embodiments, all of the standard cells in the circuit GDS file include marker layers.

In operation 504, a GDS sign-off operation is performed on the merged GDS file. The sign-off operation can include checking the design rules (including acceptable connection patterns and/or unacceptable connection patterns of pins) and determining whether any violation of the design rules has occurred. In some embodiments, the checking of the design rules includes checking whether the pins of the standard cells are marked with suitable marker layers and whether the connection patterns of pins are acceptable based on the marker layers. In some embodiments, a pin not marked with a suitable marker layer triggers a warning or an error message to the design tool (e.g., the number and/or location(s) of the unmarked pins). In some embodiments, an unacceptable connection pattern triggers a warning or an error message by the design tool (e.g., the number and/or location(s) of the unacceptable connection pattern(s)).

In operation 505, a report including design rule violations is generated. The report can include details of design rule violations such as those detected in operation 504, e.g., the number and/or locations of unacceptable connection patterns and the number and/or locations of pins not properly labeled with marker layers.

In some embodiments, after operation 505, the design rule violations can be manually or automatically corrected by the design tool. In some embodiments, the corrected GDS file can undergo operations 504 and/or 505 to detect any additional design rule violations. If no violation is detected, the resulting GDS file can be sent to manufacturing (tape-out). Thus, by using method 500, the number of unacceptable connection patterns in the GDS file can be reduced and the manufactured circuit can have improved device performance.

Figure 7:
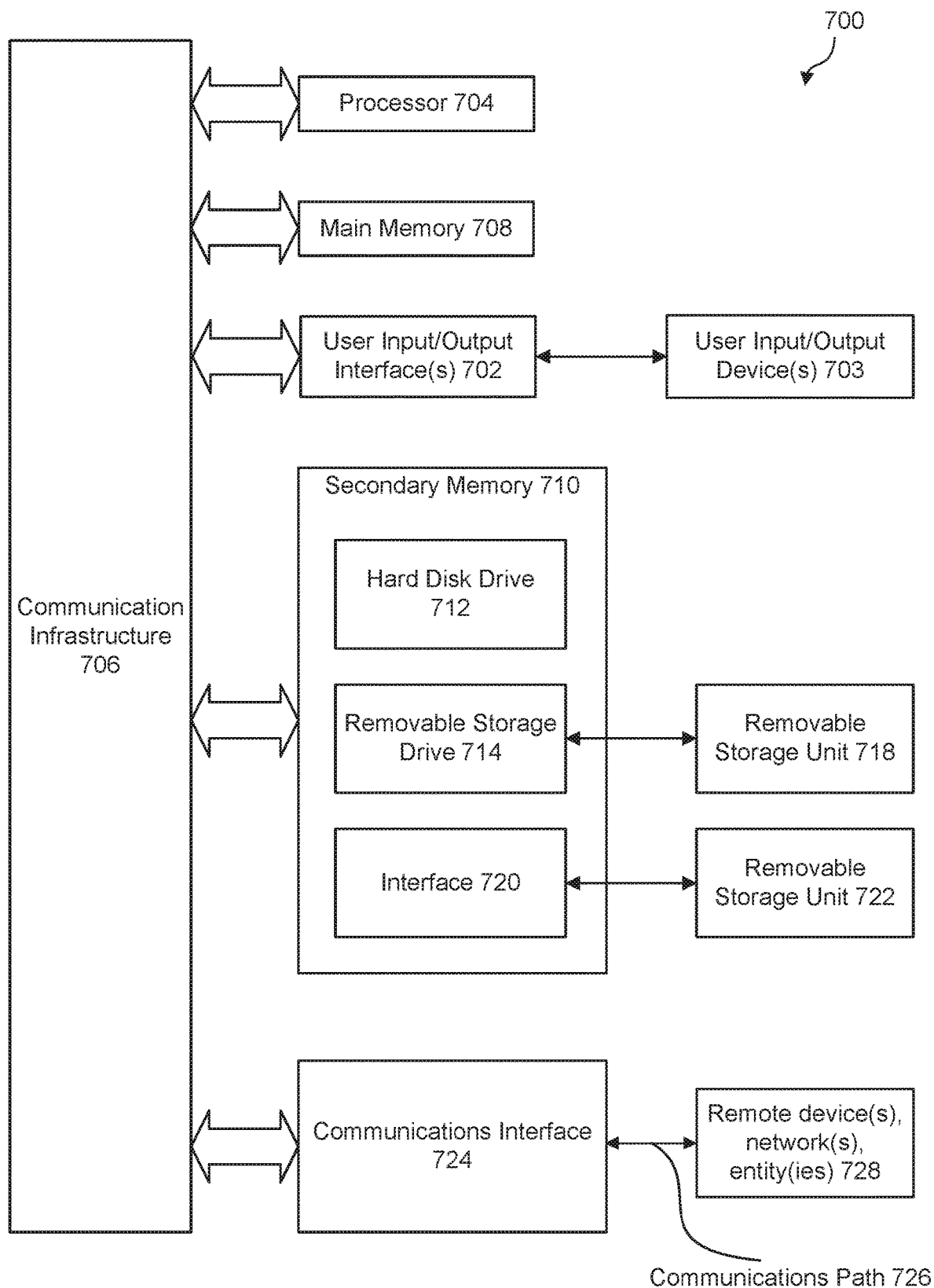
FIG. 7 is an illustration of an example computer system for implementing various embodiments of the present disclosure.

FIG. 7 is an illustration of an example computer system 700 in which various embodiments of the present disclosure can be implemented, according to some embodiments. Computer system 700 can be any well-known computer capable of performing the functions and operations described herein. For example, and without limitation, computer system 700 can be execute an EDA tool capable of selecting standard cells, placing one or more marker layers in the selected standard cells, and checking for design rule violations. Computer system 700 can be used, for example, to execute one or more operations in method 500 (and any associated sub-operations), which describes an example method for a GDS sign-off process.

Computer system 700 includes one or more processors (also called central processing units, or CPUs), such as a processor 704. Processor 704 is connected to a communication infrastructure or bus 706. Computer system 700 also includes input/output device(s) 703, such as monitors, keyboards, pointing devices, etc., that communicate with communication infrastructure or bus 706 through input/output interface(s) 702. An EDA tool can receive instructions to implement functions and operations described herein, e.g., method 500 of FIG. 5—via input/output device(s) 703. Computer system 700 also includes a main or primary memory 708, such as random access memory (RAM). Main memory 708 can include one or more levels of cache. Main memory 708 has stored therein control logic (e.g., computer software) and/or data. In some embodiments, the control logic (e.g., computer software) and/or data can include one or more of the operations described above with respect to method 500 of FIG. 5.

Computer system 700 can also include one or more secondary storage devices or memory 710. Secondary memory 710 can include, for example, a hard disk drive 712 and/or a removable storage device or drive 714. Removable storage drive 714 can be a floppy disk drive, a magnetic tape drive, a compact disk drive, an optical storage device, tape backup device, and/or any other storage device/drive.

Removable storage drive 714 can interact with a removable storage unit 718. Removable storage unit 718 includes a computer usable or readable storage device having stored thereon computer software (control logic) and/or data. Removable storage unit 718 can be a floppy disk, magnetic tape, compact disk, DVD, optical storage disk, and/any other computer data storage device. Removable storage drive 714 reads from and/or writes to removable storage unit 718 in a well-known manner.

According to some embodiments, secondary memory 710 can include other means, instrumentalities or other approaches for allowing computer programs and/or other instructions and/or data to be accessed by computer system 700. Such means, instrumentalities or other approaches can include, for example, a removable storage unit 722 and an interface 720. Examples of the removable storage unit 722 and the interface 720 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 710, removable storage unit 718, and/or removable storage unit 722 can include one or more of the operations described above with respect to method 500 of FIG. 5.

Computer system 700 can further include a communication or network interface 724. Communication interface 724 enables computer system 700 to communicate and interact with any combination of remote devices, remote networks, remote entities, etc. (individually and collectively referenced by reference number 728). For example, communication interface 724 can allow computer system 700 to communicate with remote devices 728 over communications path 726, which can be wired and/or wireless, and which can include any combination of LANs, WANs, the Internet, etc. Control logic and/or data can be transmitted to and from computer system 700 via communication path 726.

The operations in the preceding embodiments can be implemented in a wide variety of configurations and architectures. Therefore, some or all of the operations in the preceding embodiments—e.g., method 500 of FIG. 5 and method 800 of FIG. 8 (described below)—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 700, main memory 708, secondary memory 710 and removable storage units 718 and 722, as well as tangible articles of manufacture embodying any combination of the foregoing. Such control logic, when executed by one or more data processing devices (such as computer system 700), causes such data processing devices to operate as described herein. In some embodiments, computer system 700 is installed with software to perform operations in the manufacturing of photomasks and circuits, as illustrated in method 800 of FIG. 8 (described below). In some embodiments, computer system 700 includes hardware/equipment for the manufacturing of photomasks and circuit fabrication. For example, the hardware/equipment can be connected to or be part of element 728 (remote device(s), network(s), entity(ies) 728) of computer system 700.

Figure 8:
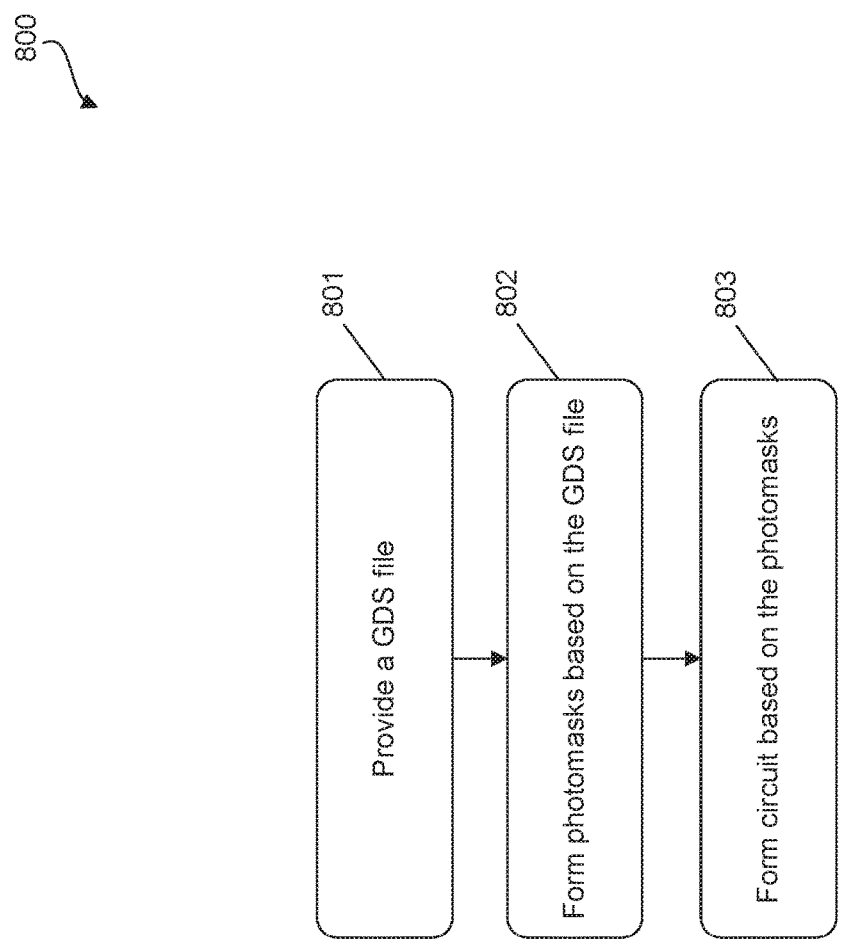
FIG. 8 is an illustration of a process to form circuit based on a graphic database system (GDS) file generated using a sign-off method, according to some embodiments.

FIG. 8 is an illustration of an exemplary method 800 for circuit fabrication, according to some embodiments. In some embodiments, operations/steps of method 800 can be performed in a different order. Variations of method 800 should also be within the scope of the present disclosure.

In operation 801, a GDS file is provided. The GDS file can be the merged GDS file described in FIG. 5. For example, the GDS file has been checked for design rule violations and errors, and any errors and/or violations have been corrected. The operation depicted in 801 can be performed by, for example, an EDA tool that operates on a computer system, such as computer system 700 described above.

In operation 802, photomasks are formed based on the GDS file. In some embodiments, the GDS file provided in operation 801 is taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or other suitable metals. Operation 802 can be performed by a photomask manufacturer, where the circuit layout is read using a suitable software tool (e.g., EDA tool) and the circuit layout is transferred onto a substrate using a suitable printing/deposition tool. The photomasks reflect the circuit layout/features included in the GDS file.

In operation 803, one or more circuits are formed based on the photomasks generated in operation 802. In some embodiments, the photomasks are used to form patterns/structures of the circuit contained in the GDS file. In some embodiments, various fabrication tools (e.g., photolithography equipment, deposition equipment, and etching equipment) are used to form features of the one or more circuits.

The present disclosure describes a "sign-off" method to detect unacceptable connection patterns in standard cells in a GDS file using marker layers. In some embodiments, the marker layers can be used to restrict pin access locations for the APR tool to access pins of the standard cell so that a desired circuit performance can be achieved. Connection patterns can be improved based on a result of the sign-off method thus improving consistency and predictability of standard cell timing (e.g., timing associated with a high-driving standard cell driving other circuits) in the IC design. Thus, the GDS file for tape-out can have a reduced number of unacceptable connection patterns and the manufactured circuit can have improved device performance.

In some embodiments, a method for detecting unacceptable connection patterns includes method includes: performing an APR process on a circuit layout that includes a first standard cell without a marker layer to generate a circuit GDS file from the circuit layout; generating a standard-cell GDS file that includes a second standard cell with at least one marker layer applied to the second standard cell; and merging the circuit GDS file with the standard-cell GDS file to generate a merged GDS file that includes the first standard cell with at least one marker layer based on the second standard cell. The method further includes determining whether a connection pattern of the first standard cell in the merged GDS file is an unacceptable connection pattern. At least one of the performing, generating, merging, and determining is performed using a processor.

In some embodiments, a non-transitory computer-readable medium includes computer-executable program for, when being executed by a processor, implementing a method for detecting unacceptable connection patterns. The method of the present disclosure includes: performing an APR process on a circuit layout that includes a first standard cell without a marker layer to generate a circuit GDS file from the circuit layout; generating a standard-cell GDS file that includes a second standard cell with at least one marker layer applied to the second standard cell; and merging the circuit GDS file with the standard-cell GDS file to generate a merged GDS file that includes the first standard cell with at least one marker layer based on the second standard cell. The method further includes determining whether a connection pattern of the first standard cell in the merged GDS file is an unacceptable connection pattern.

In some embodiments, a computer system for detecting unacceptable connection patterns, of the present disclosure, includes a memory configured for storing a program and data for detecting unacceptable connection patterns, a user interface configured for receiving information from a user, and a processor. The processor is configured to perform an APR process on a circuit layout that includes a first standard cell without a marker layer to generate a circuit GDS file from the circuit layout; generate a standard-cell GDS file that includes a second standard cell with at least one marker layer applied to the second standard cell; and merge the circuit GDS file with the standard-cell GDS file to generate a merged GDS file that includes the first standard cell with at least one marker layer based on the second standard cell. The method further includes determining whether a connection pattern of the first standard cell in the merged GDS file is an unacceptable connection pattern.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for detecting unacceptable connection patterns, the method comprising:
   performing an automated place-and-route (APR) process on a circuit layout that comprises a first standard cell without a marker layer to generate a circuit graphic database system (GDS) file from the circuit layout;
   generating a standard-cell GDS file that comprises a second standard cell with at least one marker layer applied to the second standard cell, wherein the at least one marker layer comprises one or more markers to mark pins to be connected in the standard-cell GDS file;
   merging the circuit GDS file with the standard-cell GDS file to generate a merged GDS file that comprises the first standard cell with the at least one marker layer based on the second standard cell; and
   determining whether a connection pattern of pins marked by the at least one marker layer in the first standard cell in the merged GDS file is an unacceptable connection pattern, wherein at least one of the performing, generating, merging, and determining is performed using a processor.

2. The method of claim 1, wherein the connection pattern comprises an electrical connection between a pin of the first standard cell and a metal interconnect.

3. The method of claim 2, wherein the pin comprises one or more must-join pins.

4. The method of claim 1, wherein the at least one marker layer comprises a pin-marker layer, a must-join pin marker layer, a must-join pin group marker layer, or a combination thereof.

5. The method of claim 2, wherein the circuit GDS file comprises a third standard cell, and wherein the connection pattern comprises an electrical connection between a pin of the third standard cell and the pin of the first standard cell.

6. The method of claim 1, wherein the first and second standard cells are of a same type of standard cell.

7. The method of claim 1, wherein the determining whether the connection pattern in the first standard cell is an unacceptable connection pattern comprises:
   storing a rule for acceptable connection patterns for the first standard cell;
   comparing the connection pattern in the first standard cell to the rule for acceptable connection patterns; and
   in response to the connection pattern in the first standard cell violating the rule for acceptable connections, determining the connection pattern in the first standard cell to be an unacceptable connection pattern.

8. The method of claim 7, wherein the rule for acceptable connection patterns is based on the at least one marker layer.

9. The method of claim 3, further comprising:
   placing a must-join pin group marker layer on the one or more must-join pins to indicate restricted pin access locations for the one or more must-join pins.

10. A non-transitory computer-readable medium containing computer-executable program for, when being executed by a processor, implementing a method for detecting unacceptable connection patterns, comprising:
    performing an automated place-and-route (APR) process on a circuit layout that comprises a first standard cell without a marker layer to generate a circuit graphic database system (GDS) file from the circuit layout;
    generating a standard-cell GDS file that comprises a second standard cell with at least one marker layer applied to the second standard cell, wherein the at least one marker layer comprises one or more markers to mark pins to be connected in the standard-cell GDS file;
    merging the circuit GDS file with the standard-cell GDS file to generate a merged GDS file that comprises the first standard cell with the at least one marker layer based on the second standard cell; and
    determining whether a connection pattern of pins marked by the at least one marker layer in the first standard cell in the merged GDS file is an unacceptable connection pattern.

11. The non-transitory computer-readable medium of claim 10, wherein the connection pattern comprises an electrical connection between a pin of the first standard cell and a metal interconnect.

12. The non-transitory computer-readable medium of claim 11, wherein the pin comprises one or more must-join pins.

13. The non-transitory computer-readable medium of claim 10, wherein the at least one marker layer comprises a pin-marker layer, a must-join pin marker layer, a must-join pin group marker layer, or a combination thereof.

14. The non-transitory computer-readable medium of claim 11, wherein the circuit GDS file comprises a third standard cell, and wherein the connection pattern comprises an electrical connection between a pin of the third standard cell and the pin of the first standard cell.

15. The non-transitory computer-readable medium of claim 10, wherein the first and second standard cells are of a same type of standard cell.

16. The non-transitory computer-readable medium of claim 10, wherein the determining whether the connection pattern in the first standard cell is an unacceptable connection pattern comprises:
    storing a rule for acceptable connection patterns for the first standard cell;
    comparing the connection pattern in the first standard cell to the rule for acceptable connection patterns; and
    in response to the connection pattern in the first standard cell violating the rule for acceptable connections, determining the connection pattern in the first standard cell to be an unacceptable connection pattern.

17. A computer system for detecting unacceptable connection patterns in a graphic database system (GDS) file, comprising:
    a memory configured for storing a program and data for detecting unacceptable connection patterns;
    an interface configured for receiving information; and
    a processor configured to:
       perform an automated place-and-route (APR) process on a circuit layout that comprises a first standard cell without a marker layer to generate a circuit graphic database system (GDS) file from the circuit layout;
       generate a standard-cell GDS file that comprises a second standard cell with at least one marker layer applied to the second standard cell, wherein the at least one marker layer comprises one or more markers to mark pins to be connected in the standard-cell GDS file;
       merge the circuit GDS file with the standard-cell GDS file to generate a merged GDS file that comprises the first standard cell with the at least one marker layer based on the second standard cell; and
       determine whether a connection pattern of pins marked by the at least one marker layer in the first standard cell in the merged GDS file is an unacceptable connection pattern.

18. The computer system of claim 17, wherein the connection pattern comprises an electrical connection between a pin of the first standard cell and a metal interconnect.

19. The computer system of claim 18, wherein the pin comprises one or more must-join pins.

20. The computer system of claim 17, wherein the at least one marker layer comprises a pin-marker layer, a must-join pin marker layer, a must-join pin group marker layer, or a combination thereof.

* * * * *